(12) United States Patent
Li et al.

(10) Patent No.: US 8,455,267 B2
(45) Date of Patent: Jun. 4, 2013

(54) MAGNETIC TUNNEL JUNCTION DEVICE AND FABRICATION

(75) Inventors: Xia Li, San Diego, CA (US); Seung H. Kang, San Diego, CA (US); Xiaochun Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 899 days.

(21) Appl. No.: 12/465,744

(22) Filed: May 14, 2009

(65) Prior Publication Data

US 2010/0289098 A1 Nov. 18, 2010

(51) Int. Cl.
*H01L 21/00* (2006.01)
*H01L 21/44* (2006.01)
*H01L 21/4763* (2006.01)

(52) U.S. Cl.
USPC .............. 438/3; 257/E21.576; 257/E21.665

(58) Field of Classification Search
None
See application file for complete search history.

(56) References Cited

U.S. PATENT DOCUMENTS

| | | | | |
|---|---|---|---|---|
| 6,794,697 | B1 * | 9/2004 | Sharma | 257/295 |
| 7,009,877 | B1 | 3/2006 | Huai et al. | |
| 7,088,609 | B2 | 8/2006 | Valet | |
| 7,300,711 | B2 | 11/2007 | Parkin | |
| 7,430,135 | B2 | 9/2008 | Huai et al. | |
| 2004/0140492 | A1 | 7/2004 | Ooishi | |
| 2006/0048091 | A1 * | 3/2006 | Joshi et al. | 716/21 |
| 2006/0220084 | A1 * | 10/2006 | Umehara et al. | 257/296 |
| 2007/0075736 | A1 * | 4/2007 | Goodnow et al. | 326/41 |
| 2007/0076471 | A1 | 4/2007 | Kano et al. | |
| 2007/0108543 | A1 | 5/2007 | Furuta | |
| 2007/0195594 | A1 | 8/2007 | Koga | |
| 2007/0201265 | A1 | 8/2007 | Ranjan et al. | |
| 2007/0204086 | A1 * | 8/2007 | Jaroszewski et al. | 710/262 |
| 2008/0179699 | A1 | 7/2008 | Horng et al. | |

FOREIGN PATENT DOCUMENTS

| | | |
|---|---|---|
| JP | 2007165505 | 6/2007 |
| JP | 2008218736 | 9/2008 |

OTHER PUBLICATIONS

International Search Report—PCT/US2010/034901, International Search Authority—European Patent Office Sep. 13, 2010.
Written Opinion—PCT/US2010/034901, International Search Authority—European Patent Office Sep. 13, 2010.
Diao, Zhitao et al., "Spin Transfer Switching in Dual MgO Magnetic Tunnel Junctions", Applied Physics Letters, vol. 90, Issue 13, id. 132508, Mar. 28, 2007, 3 pages, American Institute of Physics.
Huai, Yiming et al., "Spin Transfer Switching Current Reduction in Magnetic Tunnel Junction Based Spin Filter Structures", Applied Physics Letters, vol. 87, Issue 22, id. 222510, Nov. 23, 2005, 3 pages, American Institute of Physics.

(Continued)

*Primary Examiner* — Steven Loke
*Assistant Examiner* — Kevin Quinto
(74) *Attorney, Agent, or Firm* — Sam Talpalatsky; Nicholas J. Pauley; Joseph Agusta

(57) ABSTRACT

A magnetic tunnel junction (MTJ) device and fabrication method is disclosed. In a particular embodiment, a method is disclosed that includes forming a magnetic tunnel junction (MTJ) device on a structure that includes a bottom cap layer and a bottom metal-filled trench having a normal axis, the magnetic tunnel junction device including a bottom electrode, magnetic tunnel junction layers, a magnetic tunnel junction seal layer, a top electrode, and a logic cap layer, the magnetic tunnel junction device having an MTJ axis that is offset from the normal axis.

42 Claims, 13 Drawing Sheets

OTHER PUBLICATIONS

Shen, Chih-Ta et al., "Improvement of Transport Properties in Magnetic Tunneling Junctions by Capping Materials", Jun. 2007, pp. 2785-2787, vol. 43, Issue 6, IEEE Transactions on Magnetics.

Slonczewski, J.C., "Current-Driven Excitation of Magnetic Multilayers", Jun. 1996, pp. L1-L7, vol. 159, No. 1-2, Journal of Magnetism and Magnetic Materials.

Kawahara, Takayuki, et al., "2 Mb SPRAM (SPin-Transfer Torque RAM) With Bit-by-Bit Bi-Directional Current Write and Parallelizing-Direction Current Read", Jan. 2008, pp. 109-120, vol. 43, No. 1, IEEE Journal of Solid-State Circuits.

Lee, Kangho et al., "Magnetic Tunnel Junction Device and Fabrication", U.S. Appl. No. 12/396,359, filed Mar. 2, 2009, 30 pages.

Zhu, Xiaochun et al., Reducing Spin Pumping Induced Damping of a Free Layer of Memory Device, U.S. Appl. No. 12/236,956, filed Sep. 24, 2008, 20 pages.

* cited by examiner

MAGNETIC TUNNEL JUNCTION DEVICE AND FABRICATION

I. FIELD

The present disclosure is generally related to magnetic tunnel junction (MTJ) devices and fabrication.

II. DESCRIPTION OF RELATED ART

MTJ elements may be used to create a magnetic random access memory (MRAM). An MTJ element typically includes a pinned layer, a magnetic tunnel barrier, and a free layer, where a bit value is represented by a magnetic moment in the free layer. A bit value stored by an MTJ element is determined by a direction of the magnetic moment of the free layer relative to a direction of a fixed magnetic moment carried by the pinned layer. The magnetization of the pinned layer is fixed while the magnetization of the free layer may be switched.

MRAM areas containing MTJ elements and logic areas containing logic and control elements may be fabricated on the same wafer. The structures and process sequences used to form the MTJ elements are generally different from the structures and process sequences used to form the logic and control elements. It may be challenging to integrate both types of processes together without negatively impacting both the MRAM areas and the logic areas. For example, certain MRAM processes, if performed earlier in the sequence of process steps, may cause recesses in interlayer dielectric (ILD) or inter metal layer (IMD) portions of the logic areas. Similarly, certain logic processes, if performed earlier in the sequence of process steps, may add to surface roughness in the MRAM areas. The MTJ elements may be impacted by the surface roughness of an underlying copper layer, for example. In addition, bottom vias used with conventional MTJ elements may add series resistance to the MTJ elements, which may degrade a tunneling magnetoresistance (TMR) of the MTJ elements.

III. SUMMARY

The MRAM and logic processes may be integrated together, eliminating the surface roughness concerns for the MTJ devices and avoiding formation of recesses in the interlayer dielectric (ILD) portions of the logic areas. Damage to logic layers in the logic areas due to MRAM processing may be avoided by implementing a bottom cap layer formed before a copper damascene process is performed. The copper surface roughness impact may be avoided by moving the MTJ device away from the copper pad. The added series resistance of a bottom via may be avoided by directly contacting a bottom electrode of the MTJ to the copper pad. Surface roughness of the bottom cap layer may be reduced by first depositing the bottom electrode on the bottom cap layer and then adding MTJ films on the bottom electrode. The MRAM processes may be performed before the logic processes are performed. A top via may be added to selectively open the top of the MTJ device. The height of the top via may be adjustable.

In a particular embodiment, a method is disclosed that includes forming a magnetic tunnel junction (MTJ) device on a structure that includes a bottom cap layer and a bottom metal-filled trench having a normal axis. The magnetic tunnel junction device includes a bottom electrode, magnetic tunnel junction layers (anti-ferromagnetic layer, fixed layer, tunnel barrier, free layer, etc.), a magnetic tunnel junction seal layer, a top electrode, and a logic cap layer. The magnetic tunnel junction device has an MTJ axis that is offset from the normal axis. The method also includes forming and planarizing an insulating layer above the logic cap layer. The method further includes performing a copper damascene process to open a top trench in the insulating layer, to open a top via to the top electrode, to open a logic via to metal in the bottom metal-filled trench, or to open the top via and the logic via, to deposit copper in the top trench and in the top via, in the logic via, or in the top via and in the logic via, and to perform a copper chemical mechanical planarization of the deposited copper.

In another particular embodiment, an apparatus is disclosed that includes a structure that includes a bottom cap layer surrounding a metal pad. The apparatus also includes a magnetic tunnel junction (MTJ) device including a bottom electrode coupled to the structure. The MTJ device includes magnetic tunnel junction layers (an anti-ferromagnetic layer, a fixed layer, a tunnel barrier layer, a free layer, an MTJ cap layer, etc.), a top electrode, and a logic cap layer, where the MTJ device is offset with respect to the metal pad.

In another particular embodiment, a method is disclosed that includes forming a first insulating layer above a substrate. The method also includes forming a bottom cap layer above the first insulating layer. The method further includes performing a first copper damascene process to open bottom trenches and bottom vias in the first insulating layer, to plate copper in the bottom trenches and in the bottom vias, and to perform a copper chemical mechanical planarization. The copper-filled bottom trenches each have a normal axis. The method also includes forming a bottom electrode above the bottom cap layer and above the copper-filled bottom trenches, forming magnetic tunnel junction layers above the bottom electrode, forming a hardmask above the magnetic tunnel junction layers, and patterning magnetic tunnel junction (MTJ) structures each having an MTJ axis that is offset from the normal axis of an adjacent copper-filled bottom trench. The method further includes forming a magnetic tunnel junction seal layer above and adjacent to the magnetic tunnel junction structures and above the bottom electrode. The method also includes forming a second insulating layer above the magnetic tunnel junction seal layer and planarizing the second insulating layer and opening tops of the magnetic tunnel junction structures. The method further includes forming a top electrode above the planarized second insulating layer and above the tops of the magnetic tunnel junction structures and patterning the top electrode and the bottom electrode. The method also includes forming a logic cap layer above the bottom cap layer, the logic cap layer adjacent to the magnetic tunnel junction seal layer, adjacent to the second insulating layer and above the patterned top electrode. The method further includes forming and planarizing a third insulating layer above the logic cap layer and performing a second copper damascene process to open a top trench in the third insulating layer and to open at least one of a top via to the patterned top electrode and a logic via to one of the copper-filled bottom trenches, to plate copper in the top trench and in the at least one of the top via and the logic via, and to perform a copper chemical mechanical planarization.

One particular advantage provided by at least one of the disclosed embodiments is that the MRAM and logic processes may be integrated together seamlessly, eliminating the surface roughness concerns for the MTJ devices and avoiding formation of recesses in the interlayer dielectric (ILD) portions of the logic areas. Damage to logic layers in the logic areas due to MRAM processing may be avoided by implementing a bottom cap layer that is formed before a copper damascene process is performed. Surface roughness of the bottom cap layer may be reduced by first depositing the bottom electrode on the bottom cap layer and the MTJ films on the bottom electrode. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
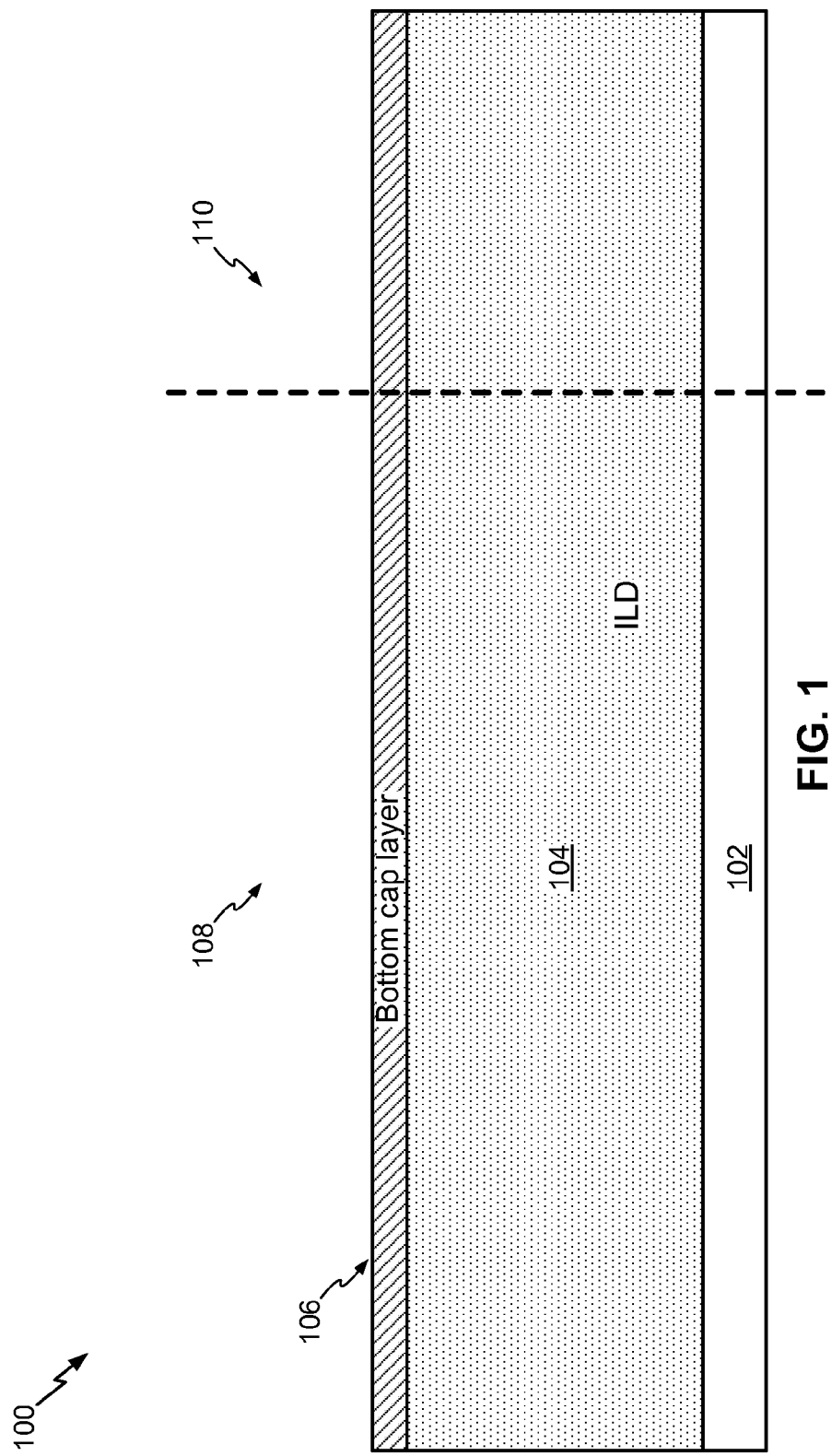
FIG. 1 is a first illustrative diagram of at least one stage in the process of fabricating a magnetic tunnel junction (MTJ) device after forming a bottom cap layer on a first insulating layer.

Particular embodiments of the present disclosure are described below with reference to the drawings. In the description, common features are designated by common reference numbers through the drawings. Referring to FIG. 1, a first illustrative diagram of at least one stage in the process of fabricating a magnetic tunnel junction (MTJ) device is depicted and generally designated 100. A first insulating layer 104 may be formed above a substrate 102. The substrate 102 represents any underlying layer, such as a cap layer for other underlying layers. For example, the first insulating layer 104 may be formed of material that is deposited on the substrate 102. A bottom cap layer 106 may be formed above the first insulating layer 104. For example, the bottom cap layer 106 may be formed of material that is deposited on the first insulating layer 104. In a particular embodiment, the bottom cap layer 106 includes silicon carbide (SiC) or silicon nitride (SiN, etc.). An MRAM area 108 of a wafer is shown and a logic area 110 of the wafer is shown. The bottom cap layer 106 may protect against the formation of recesses in the insulating layers in the MRAM area 108 and in the logic area 110.

Figure 2:
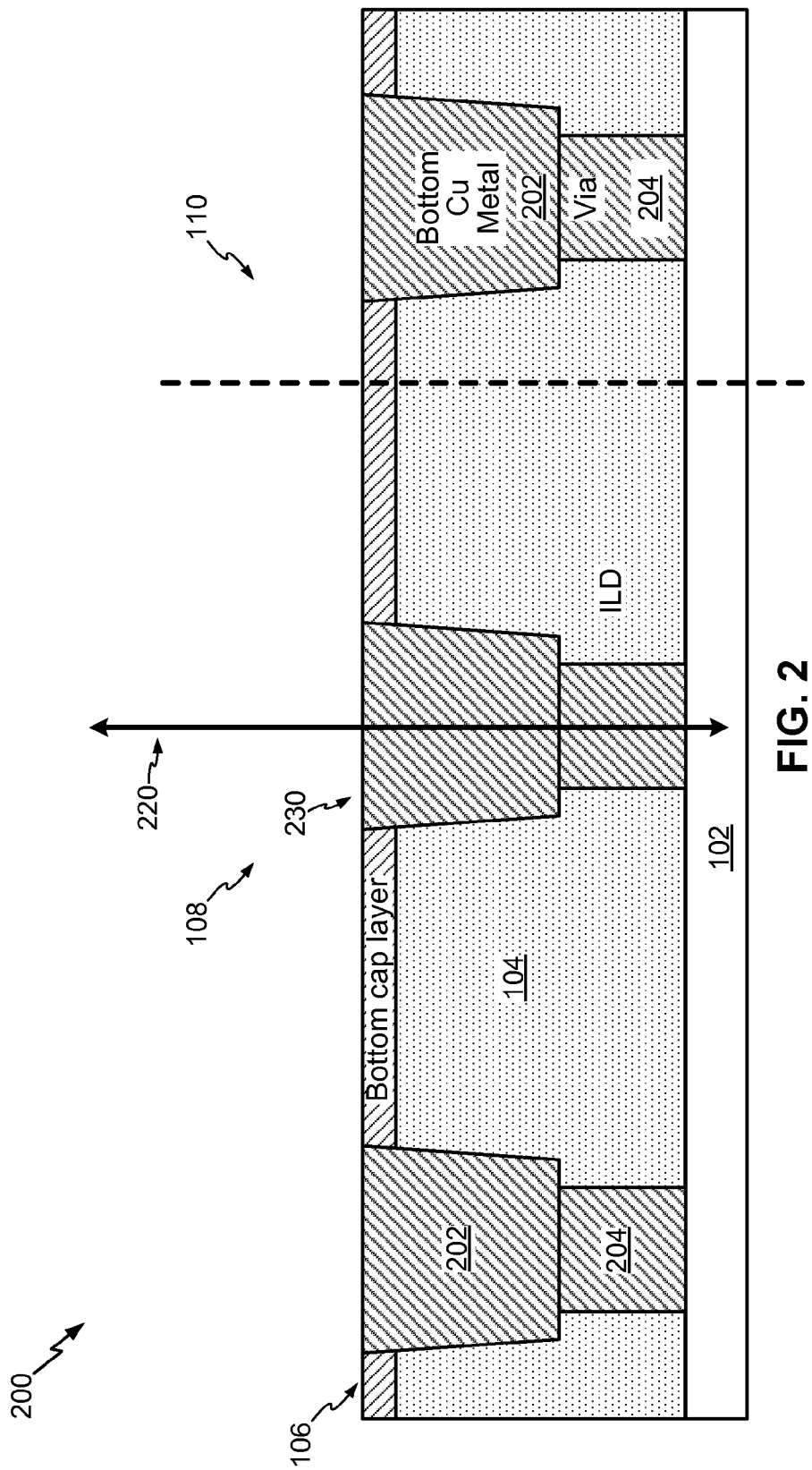
FIG. 2 is a second illustrative diagram of at least one stage in the process of fabricating a magnetic tunnel junction (MTJ) device after forming bottom metal-filled trenches and bottom vias in the first insulating layer.

Referring to FIG. 2, a second illustrative diagram of at least one stage in the process of fabricating a magnetic tunnel junction (MTJ) device is depicted and generally designated 200. A first copper damascene process may be performed to open bottom trenches 202 and bottom vias 204 in the first insulating layer 104, to plate or otherwise deposit copper in the bottom trenches 202 and in the bottom vias 204, and to perform a copper chemical mechanical planarization. For example, a logic process may define placement of the copper in the bottom trench 202 and in the bottom via 204 in the logic area 110. In an alternative embodiment, another conductive metal besides copper may be used. The copper-filled bottom trenches 202 each have a normal axis 220. The surface of each of the copper-filled bottom trenches 202 forms a copper pad 230.

Figure 3:
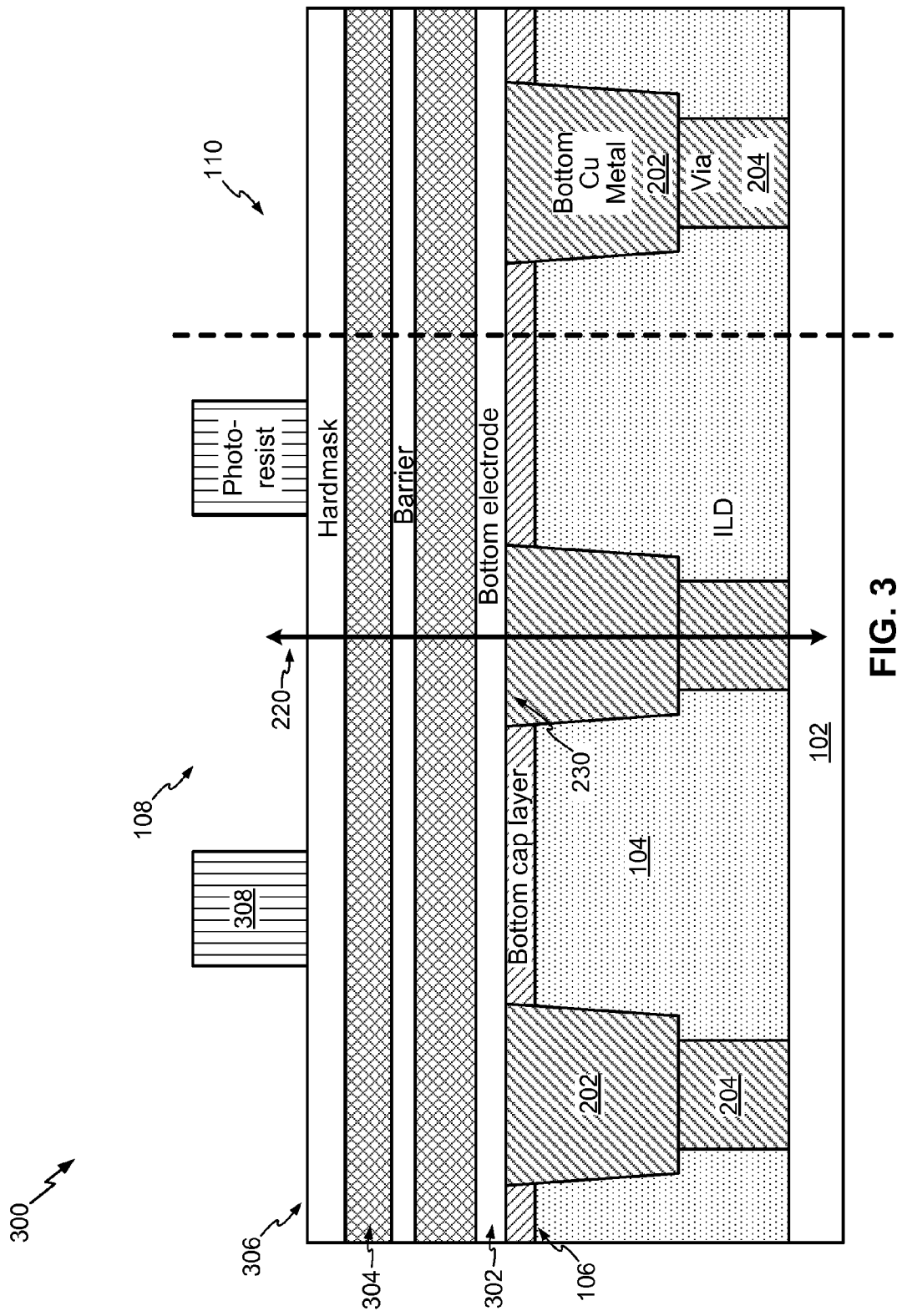
FIG. 3 is a third illustrative diagram of at least one stage in the process of fabricating a magnetic tunnel junction (MTJ) device after forming photoresist on a hardmask layer to pattern MTJ structures.

Referring to FIG. 3, a third illustrative diagram of at least one stage in the process of fabricating a magnetic tunnel junction (MTJ) device is depicted and generally designated 300. A bottom electrode 302 may be formed above the bottom cap layer 106 and above the copper in the bottom trenches 202. For example, the bottom electrode 302 may be formed of material that is deposited on the bottom cap layer 106 and on the copper in the bottom trenches 202. In a particular embodiment, the bottom electrode 302 includes at least one of tantalum and tantalum nitride. Forming the bottom electrode 302 directly on the copper in the bottom trenches 202 reduces a series resistance of a subsequently formed MTJ device as compared to using a bottom via between the bottom electrode 302 and the copper in the bottom trenches 202.

Magnetic tunnel junction layers 304 may be formed above the bottom electrode 302. For example, the magnetic tunnel junction layers 304 may be formed of materials that are deposited on the bottom electrode 302. The bottom electrode 302 and the magnetic tunnel junction layers 304 may temporarily seal and protect the copper in the bottom trenches 202. In a particular embodiment, an easy axis magnetic tunnel junction magnetic anneal of at least one of the magnetic tunnel junction layers 304 aligns a magnetic field orientation of subsequently formed magnetic tunnel junction structures 402, shown in FIG. 4. A hardmask 306 may be formed above the magnetic tunnel junction layers 304. For example, the hardmask 306 may be formed of material that is deposited on the magnetic tunnel junction layers 304. Photoresist 308 may be formed above the hardmask 306 and patterned to pattern the magnetic tunnel junction structures 402 shown in FIG. 4. For example, the photoresist 308 may be formed of material that is deposited on the hardmask 306 and may be patterned by photolithography techniques.

Figure 4:
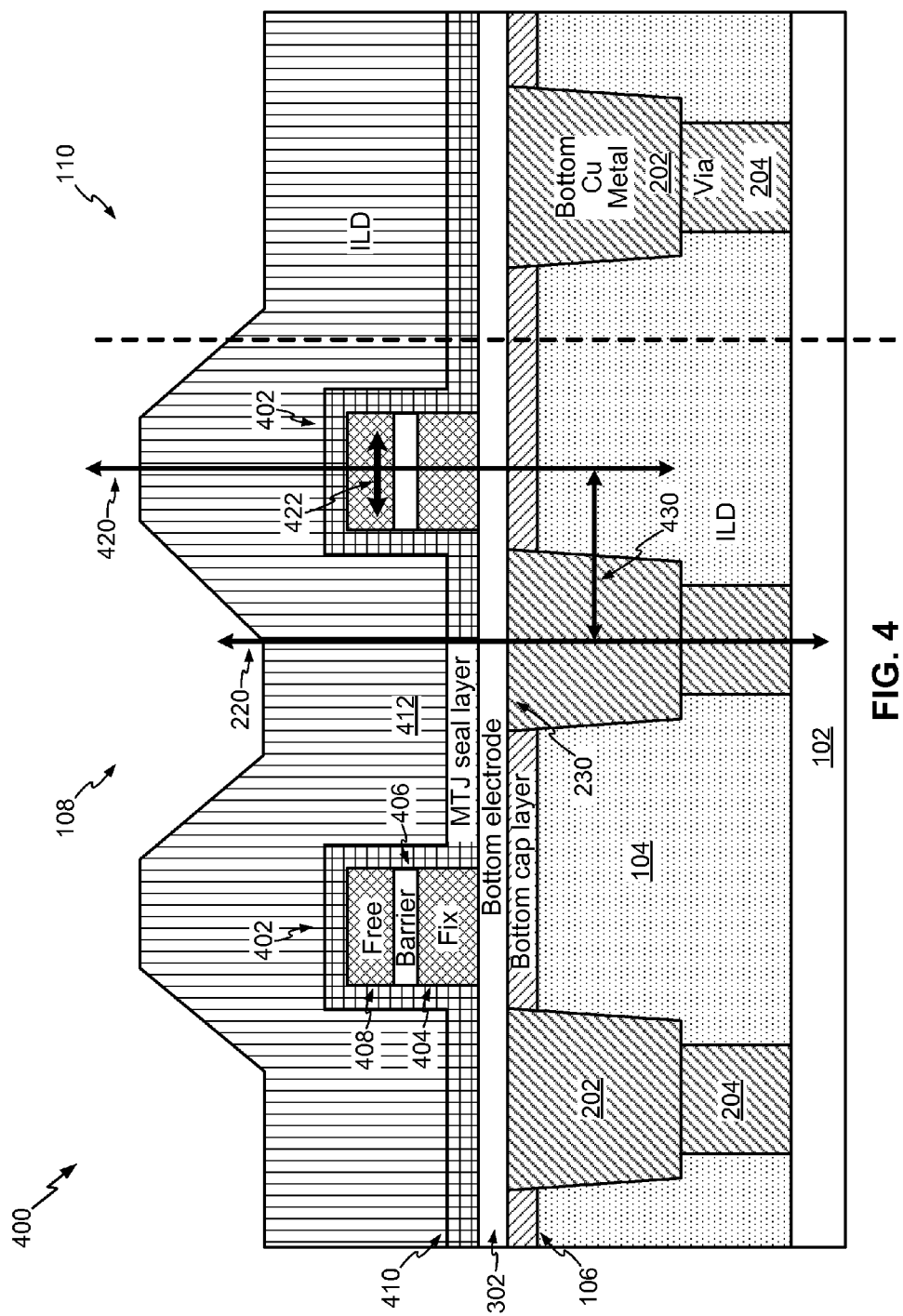
FIG. 4 is a fourth illustrative diagram of at least one stage in the process of fabricating a magnetic tunnel junction (MTJ) device after forming a second insulating layer on the MTJ structures.

Referring to FIG. 4, a fourth illustrative diagram of at least one stage in the process of fabricating a magnetic tunnel junction (MTJ) device is depicted and generally designated 400. The magnetic tunnel junction (MTJ) structures 402 may be formed above the bottom electrode 302 and also may be formed offset from the copper in the bottom trenches 202 to not overlap the copper in the bottom trenches 202. The magnetic tunnel junction structures 402 may each have an MTJ axis 420 that is offset from the normal axis 220 of an adjacent copper-filled bottom trench 202 by an offset 430. The MTJ axis 420 is a structural axis and may or may not coincide with an MTJ magnetization axis 422. For an in-plane magnetization, the MTJ magnetization axis 422 may be substantially horizontal and substantially parallel to a barrier layer 406, where the MTJ magnetization axis 422 can be parallel with the page, as shown, or perpendicular to the page. For an out-of-plane magnetization of a perpendicular MTJ (not shown), the MTJ magnetization axis 422 may be substantially parallel to the MTJ axis 420. Forming the magnetic tunnel junction structures 402 offset from the copper in the bottom trenches 202 and not overlapping the copper in the bottom trenches 202 may protect the magnetic tunnel junction structures 402 from the impact of surface roughness of the copper in the bottom trenches 202. In a particular embodiment, the offset 430 of the MTJ axis 420 from the normal axis 220 is greater than a width of the magnetic tunnel junction structure 402. The offset 430 may be selected to ensure that the magnetic tunnel junction structure 402 is formed above the bottom cap layer 106 and does not extend above the copper pad 230. The magnetic tunnel junction structures 402 may include an antiferromagnetic layer (AFM) (not shown), a fixed layer 404, the barrier layer 406, a free layer 408, and an MTJ cap layer (not shown).

A magnetic tunnel junction seal layer 410 may be formed above and adjacent to the magnetic tunnel junction structures 402 and above the bottom electrode 302. For example, the magnetic tunnel junction seal layer 410 may be formed of material that is deposited on and adjacent to the magnetic tunnel junction structures 402 and on the bottom electrode 302. In a particular embodiment, the magnetic tunnel junction seal layer 410 includes silicon nitride (SiN) or silicon carbide (SiC, etc.). A second insulating layer 412 may be formed above the magnetic tunnel junction seal layer 410. For example, the second insulating layer 412 may be formed of material that is deposited above the magnetic tunnel junction seal layer 410.

Figure 5:
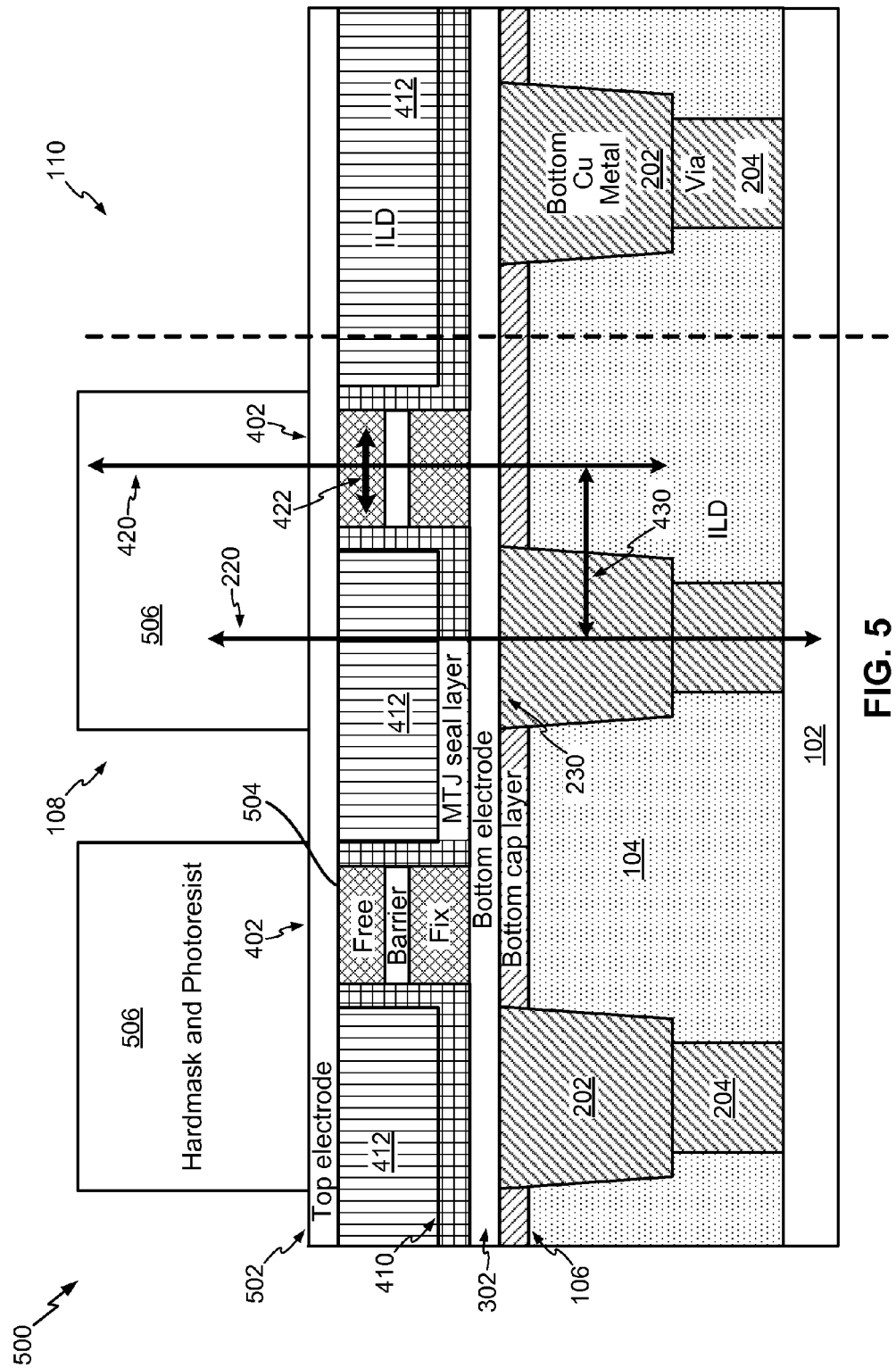
FIG. 5 is a fifth illustrative diagram of at least one stage in the process of fabricating a magnetic tunnel junction (MTJ) device after forming a hardmask and photoresist to pattern a top electrode and a bottom electrode.

Referring to FIG. 5, a fifth illustrative diagram of at least one stage in the process of fabricating a magnetic tunnel junction (MTJ) device is depicted and generally designated 500. The second insulating layer 412 may be planarized and tops 504 of the magnetic tunnel junction structures 402 may be opened. A top electrode 502 may be formed above the planarized second insulating layer 412 and above the tops 504 of the magnetic tunnel junction structures 402. For example, the top electrode 502 may be formed of material that is deposited on the planarized second insulating layer 412 and on the tops 504 of the magnetic tunnel junction structures 402. In a particular embodiment, the top electrode 502 includes at least one of tantalum and tantalum nitride.

A hardmask and photoresist 506 may be formed above the top electrode 502 and patterned to pattern the top electrode 502 and the bottom electrode 302. For example, the hardmask and photoresist 506 may be formed of materials that are deposited on the top electrode 502 and may be patterned by photolithography techniques.

Figure 6:
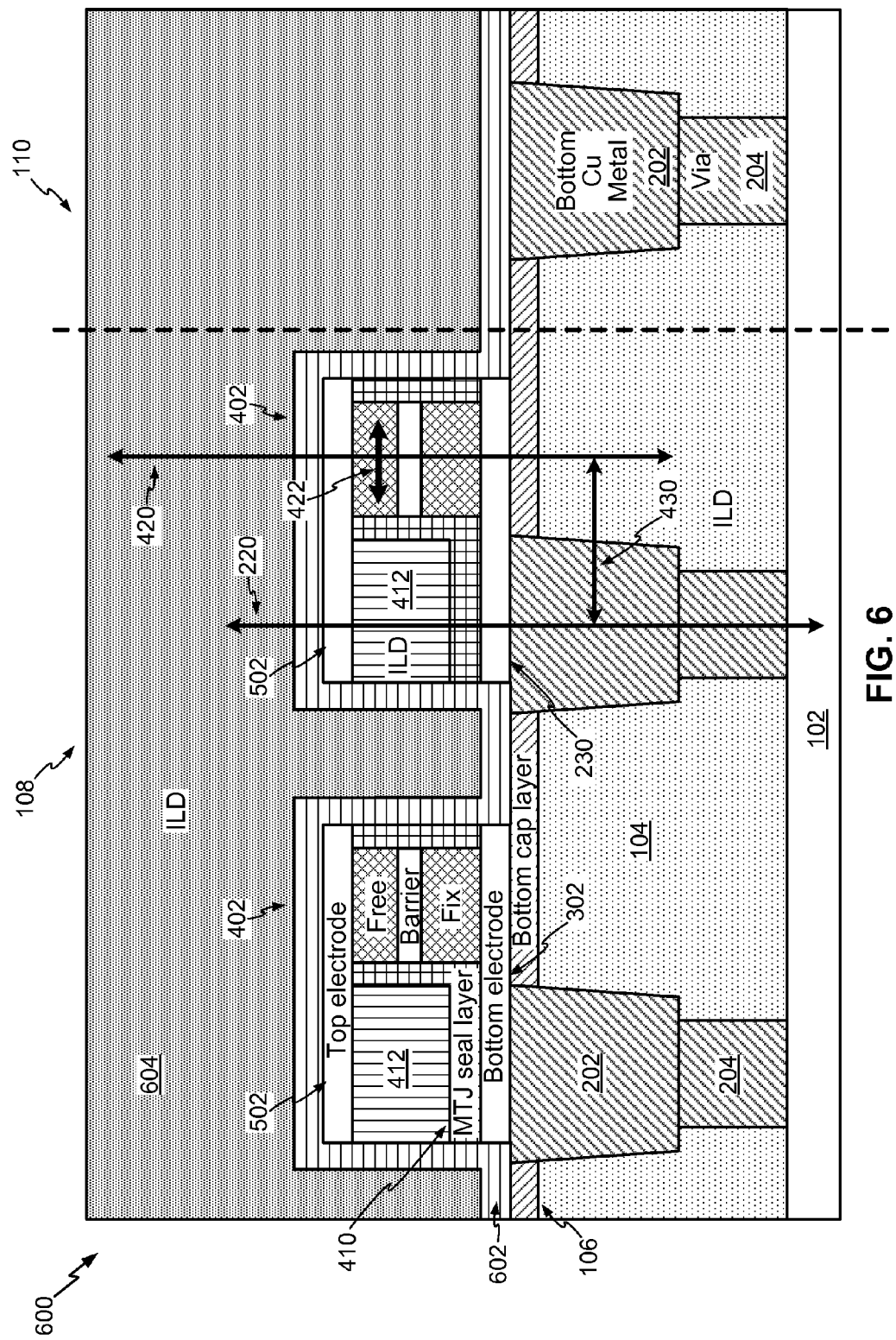
FIG. 6 is a sixth illustrative diagram of at least one stage in the process of fabricating a magnetic tunnel junction (MTJ) device after forming and planarizing a third insulating layer.

Referring to FIG. 6, a sixth illustrative diagram of at least one stage in the process of fabricating a magnetic tunnel junction (MTJ) device is depicted and generally designated 600. The top electrode 502 and the bottom electrode 302 may be patterned in accordance with the patterning of the hardmask and photoresist 506 of FIG. 5. In the MRAM area 108, all layers may have been removed down to the bottom cap layer 106 in those areas not protected by the hardmask and photoresist 506 of FIG. 5. In the logic area 110, all layers may have been removed down to the bottom cap layer 106 and the copper in the bottom trench 202.

A logic cap layer 602 may be formed above the bottom cap layer 106, the logic cap layer 602 adjacent to the magnetic tunnel junction seal layer 410, adjacent to the second insulating layer 412, and above the patterned top electrode 502. For example, the logic cap layer 602 may be formed of material that is deposited on the bottom cap layer 106, adjacent to the magnetic tunnel junction seal layer 410, adjacent to the second insulating layer 412, and on the patterned top electrode 502. In the MRAM area 108, the logic cap layer 602 may seal the magnetic tunnel junction structures 402. In the logic area 110, the logic cap layer 602 may be formed above the bottom cap layer 106 and above the copper in the bottom trench 202. For example, in the logic area 110, the logic cap layer 602 may be formed of material that is deposited on the bottom cap layer 106 and on the copper in the bottom trench 202. In the logic area 110, the logic cap layer 602 may seal the copper in the bottom trench 202. In a particular embodiment, the logic cap layer 602 includes silicon carbide (SiC) or silicon nitride (SiN, etc.). A third insulating layer 604 may be formed and planarized above the logic cap layer 602. For example, the third insulating layer 604 may be formed of material that is deposited on the logic cap layer 602 and planarized.

Figure 7:
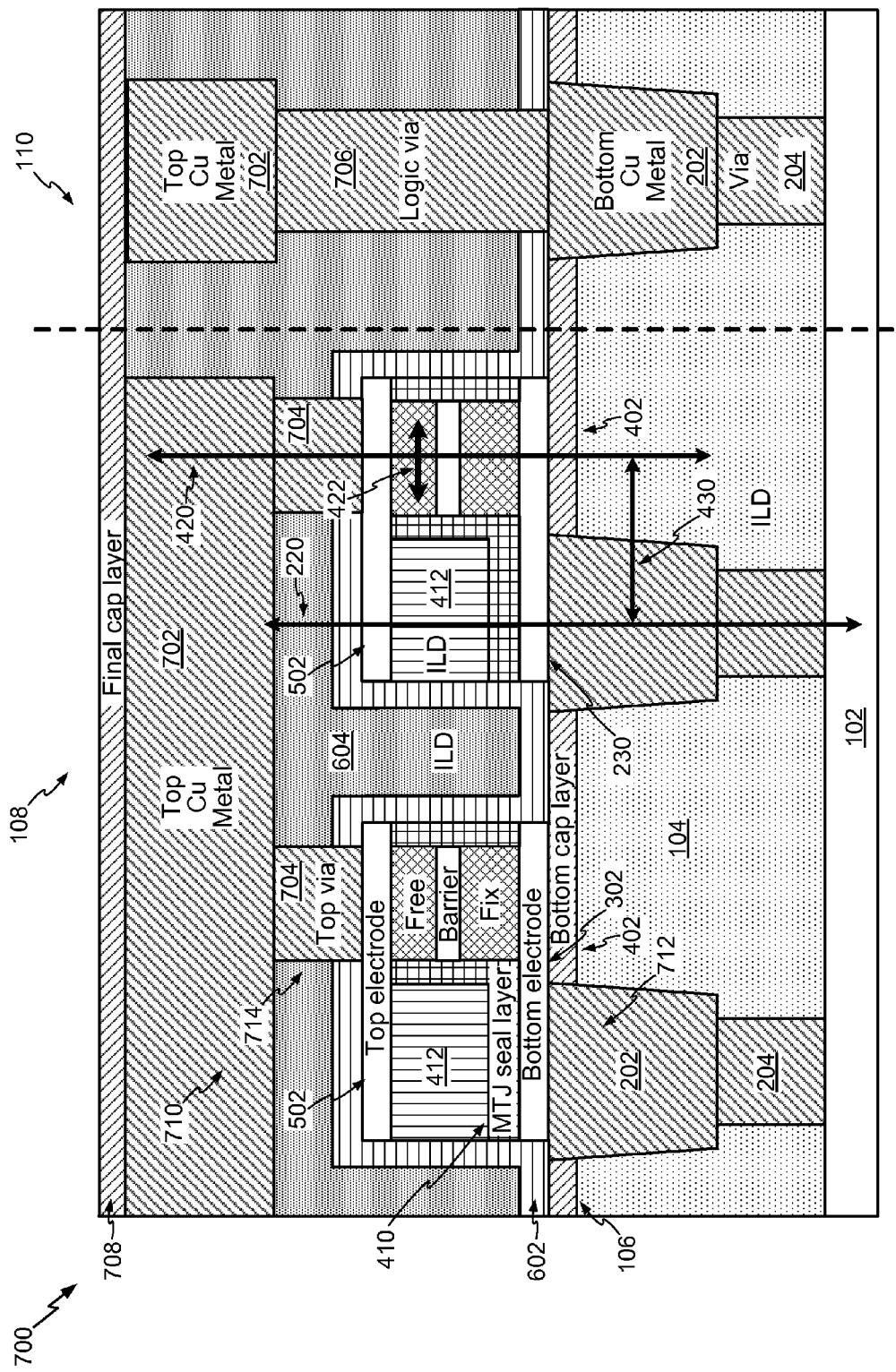
FIG. 7 is a seventh illustrative diagram of at least one stage in the process of fabricating a magnetic tunnel junction (MTJ) device after forming a top copper-filled trench and a top via and a logic via in the third insulating layer.

Referring to FIG. 7, a seventh illustrative diagram of at least one stage in the process of fabricating a magnetic tunnel junction (MTJ) device is depicted and generally designated 700. A second copper damascene process may be performed to open top trenches 702 in the third insulating layer 604 and to open at least one of a top via 704 to the patterned top electrode 502 and a logic via 706 to the copper in the bottom trench 202, to plate or otherwise deposit copper in the top trenches 702 and in the at least one of the top via 704 and the logic via 706, and to perform a copper chemical mechanical planarization. In a particular embodiment, the top via 704 and the logic via 706 can be formed together in a common process stage. Forming the top vias 704 and the logic vias 706 together in a common process stage saves an extra photolithography masking step as compared to forming the top vias 704 and the logic vias 706 in separate process stages. In an alternative embodiment, the top vias 704 may be opened selectively to the logic cap layer 602 of the magnetic tunnel junction structures 402 independently of the logic vias 706. In a particular embodiment, a final cap layer 708 may be formed above the copper in the top trenches 702 and above the third insulating layer 604. For example, the final cap layer 708 may be formed of material that is deposited on the copper in the top trenches 702 and on the third insulating layer 604.

An apparatus 710 may be formed that includes a structure 712 that includes the bottom cap layer 106 surrounding a metal pad, such as the copper pad 230. The apparatus 710 also includes a magnetic tunnel junction (MTJ) device 714, the MTJ device 714 including the bottom electrode 302 coupled to the structure 712, the MTJ device 714 including the magnetic tunnel junction layers in the magnetic tunnel junction structure 402, the top electrode 502, and the logic cap layer 602, where the MTJ device 714 is offset with respect to the metal pad, such as the copper pad 230. In a particular embodiment, the offset 430 defines a distance in a direction parallel to a surface of the metal pad, such as the surface of the copper pad 230, that is substantially parallel to and farthest from the substrate 102. In a particular embodiment, the bottom cap layer 106 is formed before the copper-filled bottom trenches 202 are formed. The magnetic tunnel junction layers in the magnetic tunnel junction structure 402 may not overlap the copper pad 230. In a particular embodiment, the magnetic tunnel junction layers in the magnetic tunnel junction structure 402 of the MTJ device 714 are not directly above the copper pad 230.

Figure 8:
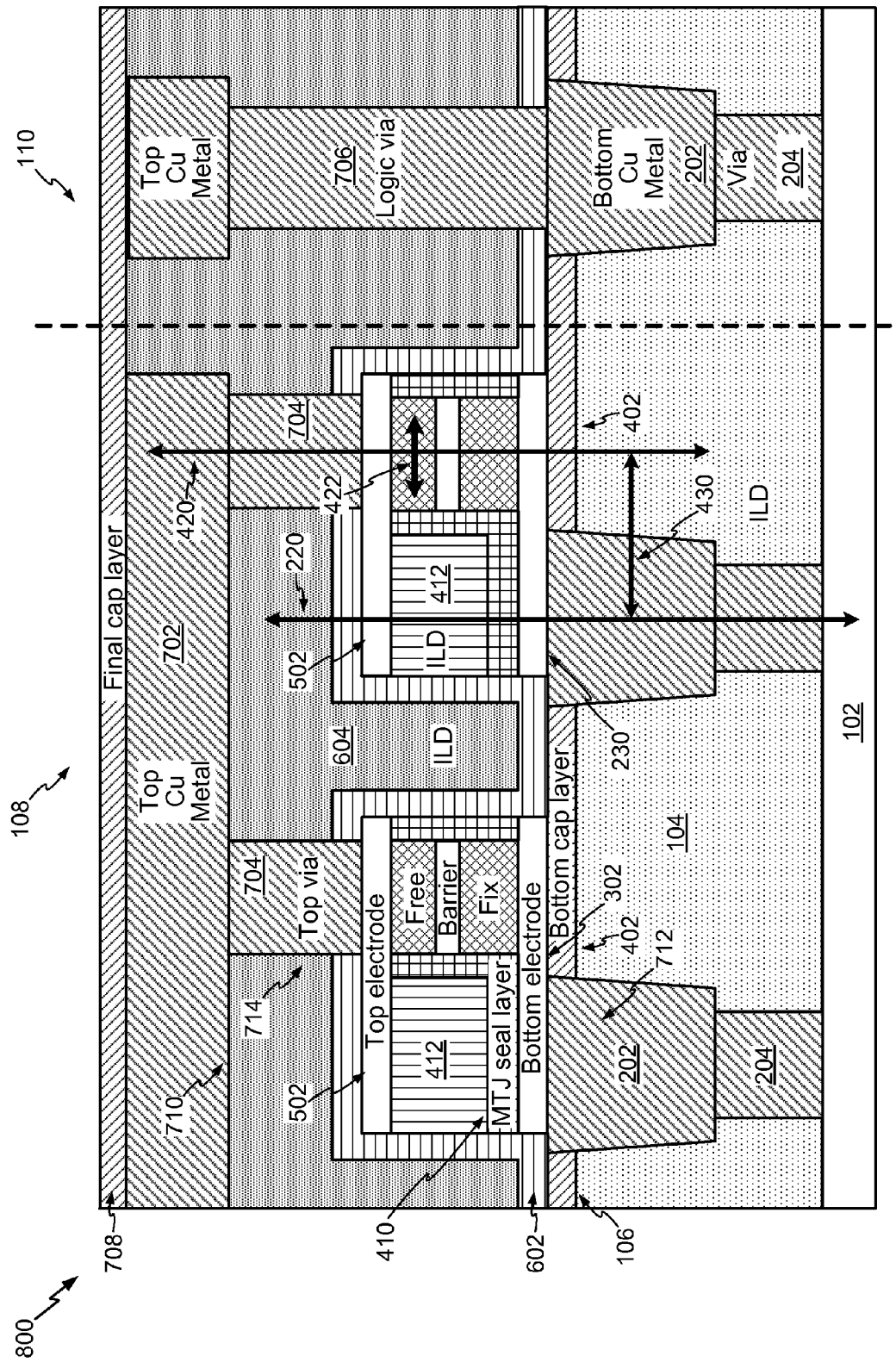
FIG. 8 is an eighth illustrative diagram of at least one stage in the process of fabricating a magnetic tunnel junction (MTJ) device after forming a top copper-filled trench and a top via and a logic via in the third insulating layer, the top via and the logic via having different heights than the top via and the logic via of FIG. 7.

Referring to FIG. 8, an eighth illustrative diagram of at least one stage in the process of fabricating a magnetic tunnel junction (MTJ) device is depicted and generally designated 800. In a particular embodiment, the height of the top via 704 is adjustable. FIG. 7 and FIG. 8 show the top vias 704 having different heights that may be adjusted in accordance with processing requirements and layer thicknesses. The formation of the top vias 704, by etching, for example, stops at the logic cap layer 602 of the magnetic tunnel junction structures 402. Similarly, the formation of the logic vias 706, by etching, for example, stops at the logic cap layer 602 on the copper in the bottom trench 202. A metal trench etching will break through the logic cap layer 602 of the top vias 704 and the logic vias 706. Then metal plating or deposition can fill metal into the top vias 704, the logic vias 706, and the top trenches 702. A metal chemical mechanical planarization (CMP) process will remove extra metal film above the top trenches 702.

Figure 9:
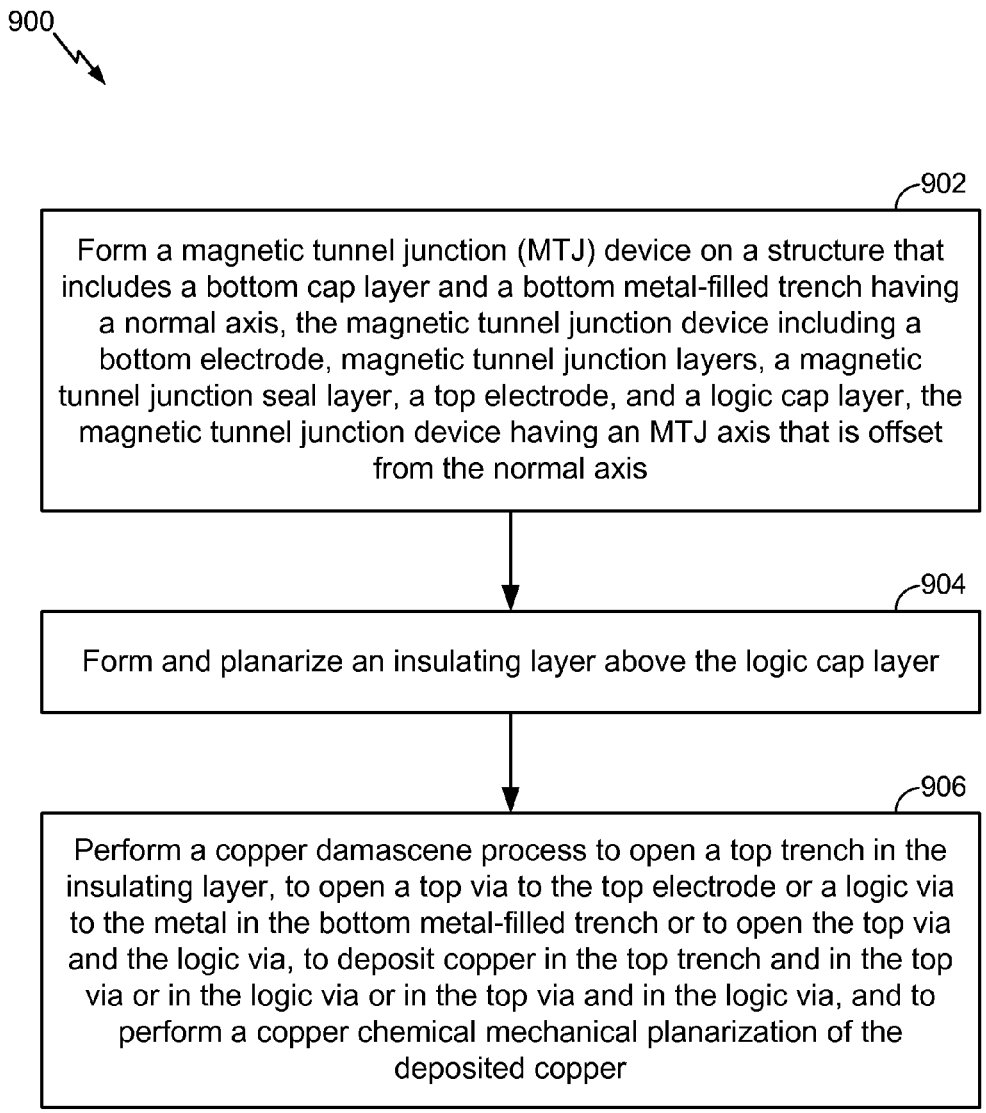
FIG. 9 is a flow diagram of a first illustrative embodiment of a method of forming a magnetic tunnel junction (MTJ) device.

FIG. 9 is a flow diagram of a first illustrative embodiment 900 of a method of forming a magnetic tunnel junction (MTJ) device. In the first illustrative embodiment 900, the method includes forming a magnetic tunnel junction (MTJ) device on a structure that includes a bottom cap layer and a bottom metal-filled trench having a normal axis, the magnetic tunnel junction device including a bottom electrode, magnetic tunnel junction layers, a magnetic tunnel junction seal layer, a top electrode, and a logic cap layer, the magnetic tunnel junction device having an MTJ axis that is offset from the normal axis, at 902. In a particular embodiment, the metal-filled bottom trench 202 is substantially filled with copper. In a particular embodiment, the metal-filled bottom trench 202 forms the copper pad 230, where at least a portion of the bottom electrode 302 is formed on the copper pad 230.

For example, the magnetic tunnel junction device 714 of FIG. 7 may be formed on the structure 712 of FIG. 7 that includes the bottom cap layer 106 of FIG. 1 and the bottom trench 202 of FIG. 2 filled with copper that has the normal axis 220. The magnetic tunnel junction device 714 of FIG. 7 may include the bottom electrode 302 of FIG. 3, the magnetic tunnel junction layers in the magnetic tunnel junction structure 402 of FIG. 4, the magnetic tunnel junction seal layer 410 of FIG. 4, the top electrode 502 of FIG. 5, and the logic cap layer 602 of FIG. 6. The magnetic tunnel junction device 714 of FIG. 7 may have the MTJ axis 420 that is offset from the normal axis 220 by the offset 430. In a particular embodiment, the bottom cap layer 106 of FIG. 1 is formed before the copper-filled bottom trench 202 of FIG. 2 is formed.

The method also includes forming and planarizing an insulating layer above the logic cap layer, at 904. For example, the third insulating layer 604 of FIG. 6 may be formed above the logic cap layer 602 of FIG. 6 and planarized.

The method further includes performing a copper damascene process to open a top trench in the insulating layer, to open a top via to the top electrode or a logic via to the metal in the bottom metal-filled trench or to open the top via and the logic via, to deposit copper in the top trench and in the top via or in the logic via or in the top via and in the logic via, and to perform a copper chemical mechanical planarization of the deposited copper, at 906. For example, the second copper damascene process may be performed to open the top trenches 702 of FIG. 7 in the third insulating layer 604 of FIG. 6, to open the top via 704 of FIG. 7 to the top electrode 502 of FIG. 5 or the logic via 706 of FIG. 7 to the copper in the bottom trench 202 of FIG. 2 or to open the top via 704 and the logic via 706, to plate copper in the top trench 702 and in the top via 704 or in the logic via 706 or in the top via 704 and in the logic via 706, and to perform a copper chemical mechanical planarization of the copper.

Figure 10:
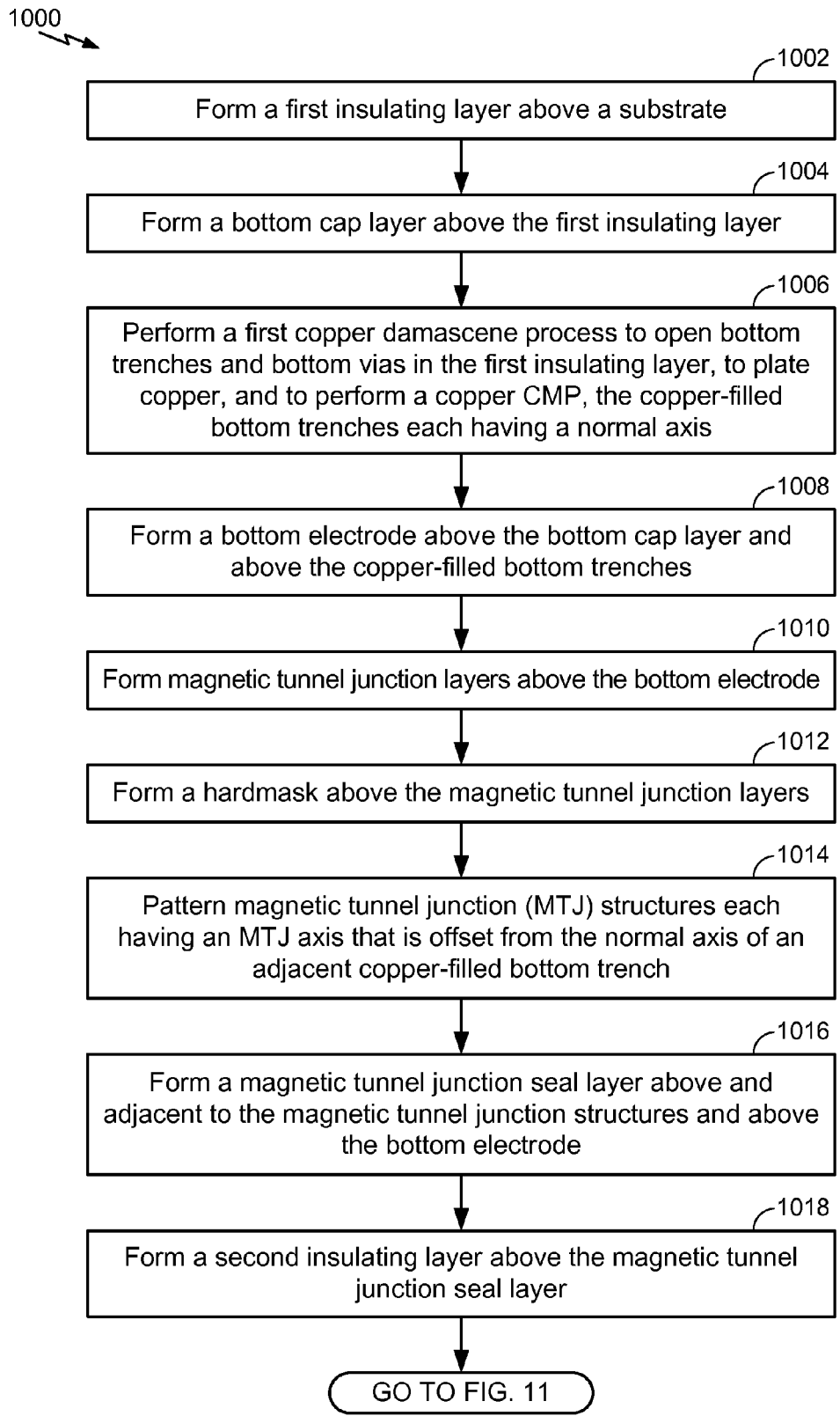
FIG. 10 is a flow diagram of a first portion of a second illustrative embodiment of a method of forming a magnetic tunnel junction (MTJ) device.

FIG. 10 is a flow diagram of a first portion 1000 of a second illustrative embodiment of a method of forming a magnetic tunnel junction (MTJ) device. In the first portion 1000 of the second illustrative embodiment, the method includes forming a first insulating layer above a substrate, at 1002. For example, the first insulating layer 104 of FIG. 1 may be formed above the substrate 102 of FIG. 1. The method also includes forming a bottom cap layer above the first insulating layer, at 1004. For example, the bottom cap layer 106 of FIG. 1 may be formed above the first insulating layer 104 of FIG. 1.

The method further includes performing a first copper damascene process to open bottom trenches and bottom vias in the first insulating layer, to plate copper in the bottom trenches and in the bottom vias, and to perform a copper chemical mechanical planarization (CMP), the copper-filled bottom trenches each having a normal axis, at 1006. For example, the first copper damascene process may be performed to open the bottom metal trenches 202 of FIG. 2 and the bottom vias 204 of FIG. 2 in the first insulating layer 104 of FIG. 1, to plate copper in the bottom metal trenches 202 and in the bottom vias 204, and to perform a copper chemical mechanical planarization, the copper-filled bottom trenches each having the normal axis 220. The method also includes forming a bottom electrode above the bottom cap layer and above the copper-filled bottom trenches, at 1008, forming magnetic tunnel junction layers above the bottom electrode, at 1010, forming a hardmask above the magnetic tunnel junction layers, at 1012, and patterning magnetic tunnel junction (MTJ) structures each having an MTJ axis that is offset from the normal axis of an adjacent copper-filled bottom trench, at 1014. For example, the bottom electrode 302 of FIG. 3 may be formed above the bottom cap layer 106 of FIG. 1 and above the copper-filled bottom trench 202 of FIG. 2, the magnetic tunnel junction layers 304 of FIG. 3 may be formed above the bottom electrode 302 of FIG. 3, the hardmask 306 of FIG. 3 may be formed above the magnetic tunnel junction layers 304, and the hardmask 306 and the photoresist 308 of FIG. 3 may be used to pattern the magnetic tunnel junction structures 402 of FIG. 4 to not overlap the copper-filled bottom trenches 202. Each of the magnetic tunnel junction structures 402 may have the MTJ axis 420 that is offset 430 from the normal axis 220 of an adjacent copper-filled bottom trench 202.

The method further includes forming a magnetic tunnel junction seal layer above and adjacent to the magnetic tunnel junction structures and above the bottom electrode, at 1016. For example, the magnetic tunnel junction seal layer 410 of FIG. 4 may be formed above and adjacent to the magnetic tunnel junction structures 402 of FIG. 4 and above the bottom electrode 302 of FIG. 3. The method also includes forming a second insulating layer above the magnetic tunnel junction seal layer, at 1018. For example, the second insulating layer 412 of FIG. 4 may be formed above the magnetic tunnel junction seal layer 410 of FIG. 4.

Figure 11:
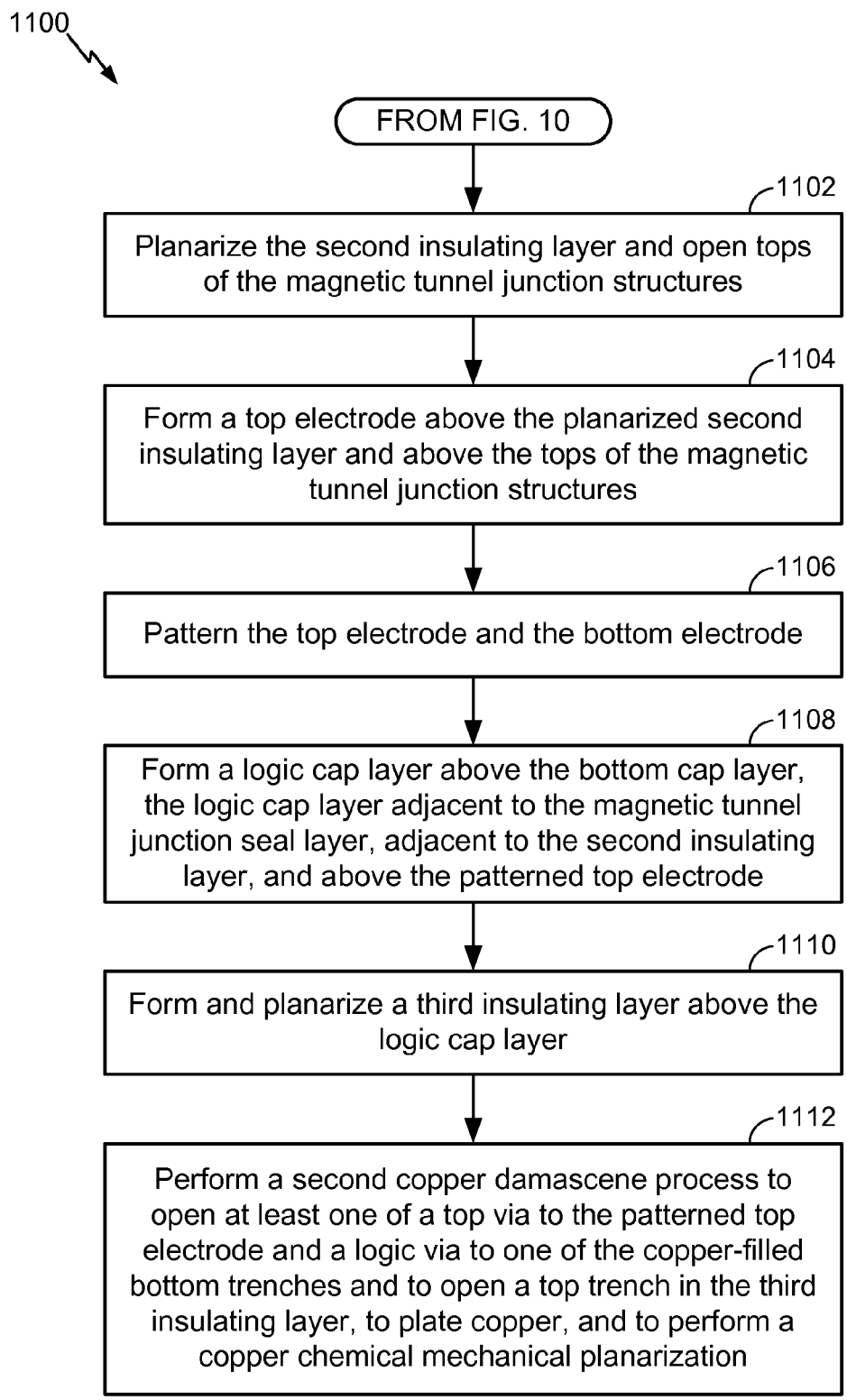
FIG. 11 is a flow diagram of a second portion of the second illustrative embodiment of a method of forming a magnetic tunnel junction (MTJ) device.

FIG. 11 is a flow diagram of a second portion 1100 of the second illustrative embodiment of a method of forming a magnetic tunnel junction (MTJ) device. In the second portion 1100 of the second illustrative embodiment, the method includes planarizing the second insulating layer and opening tops of the magnetic tunnel junction structures, at 1102, forming a top electrode above the planarized second insulating layer and above the tops of the magnetic tunnel junction structures, at 1104, and patterning the top electrode and the bottom electrode, at 1106. For example, the second insulating layer 412 of FIG. 4 may be planarized, opening the tops 504 of FIG. 5 of the magnetic tunnel junction structures 402 of FIG. 4, the top electrode 502 of FIG. 5 may be formed above the planarized second insulating layer 412 of FIG. 4 and above the tops 504 of FIG. 5 of the magnetic tunnel junction structures 402 of FIG. 4, and the hardmask and photoresist 506 of FIG. 5 may be patterned and used to pattern the top electrode 502 of FIG. 5 and the bottom electrode 302 of FIG. 3. The method further includes forming a logic cap layer above the bottom cap layer, the logic cap layer adjacent to the magnetic tunnel junction seal layer, adjacent to the second insulating layer, and above the patterned top electrode, at 1108. For example, the logic cap layer 602 of FIG. 6 may be formed above the bottom cap layer 106 of FIG. 1, adjacent to the magnetic tunnel junction seal layer 410 of FIG. 4, adjacent to the second insulating layer 412 of FIG. 4, and above the patterned top electrode 502 of FIG. 5.

The method also includes forming and planarizing a third insulating layer above the logic cap layer, at 1110, and performing a second copper damascene process to open at least one of a top via to the patterned top electrode and a logic via to one of the copper-filled bottom trenches and to open a top trench in the third insulating layer, to plate copper in the top trench and in the at least one of the top via and the logic via, and to perform a copper chemical mechanical planarization, at 1112. For example, the third insulating layer 604 of FIG. 6 may be formed and planarized above the logic cap layer 602 of FIG. 6, and the second copper damascene process may be performed to open at least one of the top via 704 of FIG. 7 to the patterned top electrode 502 of FIG. 5 and the logic via 706 of FIG. 7 to the copper-filled bottom trench 202 of FIG. 2 and to open the top trenches 702 of FIG. 7 in the third insulating layer 604 of FIG. 6, to plate copper in the top trenches 702 and in the at least one of the top via 704 and the logic via 706, and to perform a copper chemical mechanical planarization.

Figure 12:
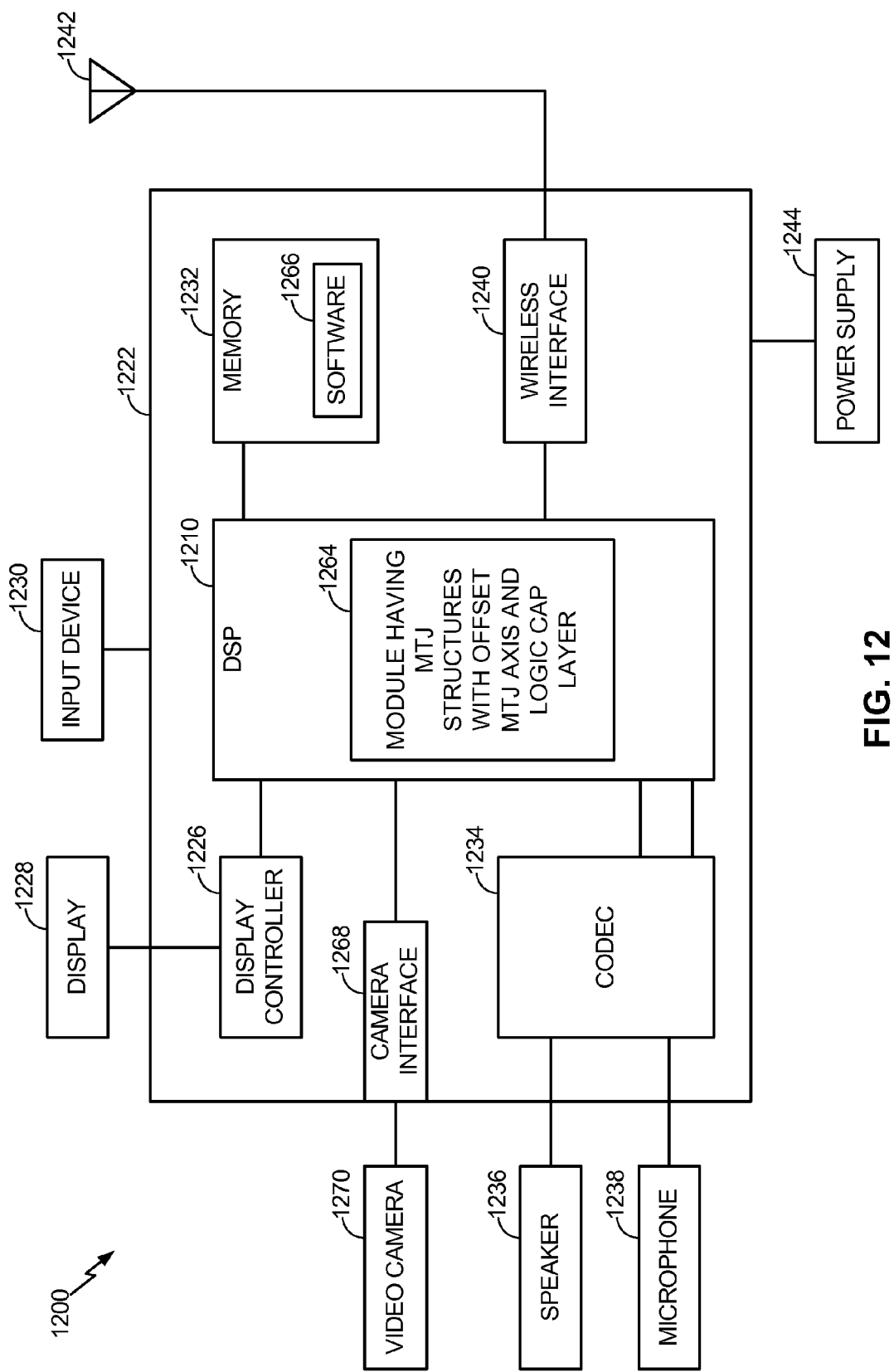
FIG. 12 is a block diagram of a particular embodiment of a portable communication device including a module having MTJ structures with an offset MTJ axis.

FIG. 12 is a block diagram of particular embodiment of a system 1200 including a module having MTJ structures with an offset MTJ axis and a logic cap layer 1264. The system 1200 may be implemented in a portable electronic device and includes a processor 1210, such as a digital signal processor (DSP), coupled to computer readable medium, such as a memory 1232, storing computer readable instructions, such as software 1266. The system 1200 includes the module having MTJ structures with an offset MTJ axis and a logic cap layer 1264. In an illustrative example, the module having MTJ structures with an offset MTJ axis and a logic cap layer 1264 includes the MTJ structure of FIG. 7, produced in accordance with any of the embodiments of FIGS. 9-11, or any combination thereof. The module having MTJ structures with an offset MTJ axis and a logic cap layer 1264 may be in the processor 1210 or may be a separate device or circuitry (not shown). In a particular embodiment, as shown in FIG. 12, the module having MTJ structures with an offset MTJ axis and a logic cap layer 1264 is accessible to the digital signal processor (DSP) 1210. In another particular embodiment, the memory 1232 includes an STT-MRAM memory array that includes the module having MTJ structures with an offset MTJ axis and a logic cap layer 1264.

A camera interface 1268 is coupled to the processor 1210 and also coupled to a camera, such as a video camera 1270. A display controller 1226 is coupled to the processor 1210 and to a display device 1228. A coder/decoder (CODEC) 1234 can also be coupled to the processor 1210. A speaker 1236 and a microphone 1238 can be coupled to the CODEC 1234. A wireless interface 1240 can be coupled to the processor 1210 and to a wireless antenna 1242.

In a particular embodiment, the processor 1210, the display controller 1226, the memory 1232, the CODEC 1234, the wireless interface 1240, and the camera interface 1268 are included in a system-in-package or system-on-chip device 1222. In a particular embodiment, an input device 1230 and a power supply 1244 are coupled to the system-on-chip device 1222. Moreover, in a particular embodiment, as illustrated in FIG. 12, the display device 1228, the input device 1230, the speaker 1236, the microphone 1238, the wireless antenna 1242, the video camera 1270, and the power supply 1244 are external to the system-on-chip device 1222. However, each of the display device 1228, the input device 1230, the speaker 1236, the microphone 1238, the wireless antenna 1242, the video camera 1270, and the power supply 1244 can be coupled to a component of the system-on-chip device 1222, such as an interface or a controller.

The foregoing disclosed devices and functionalities (such as the device of FIG. 7, the methods of FIG. 9, FIG. 10, or FIG. 11, or any combination thereof) may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then employed in electronic devices.

Figure 13:
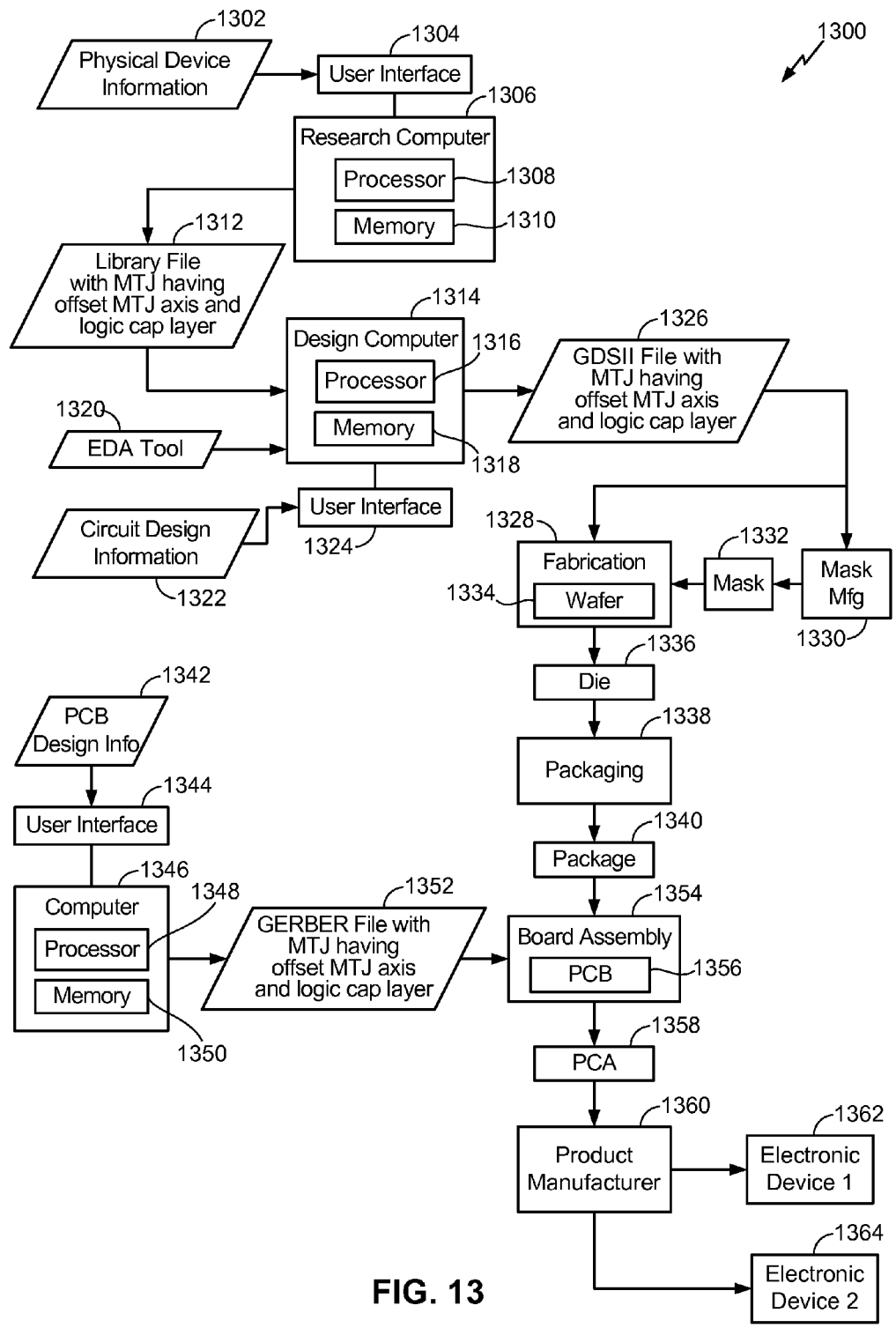
FIG. 13 is a data flow diagram illustrating a manufacturing process for use with magnetic tunnel junction (MTJ) devices.

FIG. 13 depicts a particular illustrative embodiment of an electronic device manufacturing process 1300.

Physical device information 1302 is received in the manufacturing process 1300, such as at a research computer 1306. The physical device information 1302 may include design information representing at least one physical property of a semiconductor device, such as the MTJ device 714 of FIG. 7. For example, the physical device information 1302 may include physical parameters, material characteristics, and structure information that is entered via a user interface 1304 coupled to the research computer 1306. The research computer 1306 includes a processor 1308, such as one or more processing cores, coupled to a computer readable medium such as a memory 1310. The memory 1310 may store computer readable instructions that are executable to cause the processor 1308 to transform the physical device information 1302 to comply with a file format and to generate a library file 1312.

In a particular embodiment, the library file 1312 includes at least one data file including the transformed design information. For example, the library file 1312 may include a library of semiconductor devices including the MTJ device 714 of FIG. 7, that is provided for use with an electronic design automation (EDA) tool 1320.

The library file 1312 may be used in conjunction with the EDA tool 1320 at a design computer 1314 including a processor 1316, such as one or more processing cores, coupled to a memory 1318. The EDA tool 1320 may be stored as processor executable instructions at the memory 1318 to enable a user of the design computer 1314 to design a circuit using the MTJ device 714 of FIG. 7, of the library file 1312. For example, a user of the design computer 1314 may enter circuit design information 1322 via a user interface 1324 coupled to the design computer 1314. The circuit design information 1322 may include design information representing at least one physical property of a semiconductor device, such as the MTJ device 714 of FIG. 7. To illustrate, the circuit design property may include identification of particular circuits and relationships to other elements in a circuit design, positioning information, feature size information, interconnection information, or other information representing a physical property of a semiconductor device.

The design computer 1314 may be configured to transform the design information, including the circuit design information 1322, to comply with a file format. To illustrate, the file formation may include a database binary file format representing planar geometric shapes, text labels, and other information about a circuit layout in a hierarchical format, such as a Graphic Data System (GDSII) file format. The design computer 1314 may be configured to generate a data file including the transformed design information, such as a GDSII file 1326 that includes information describing the MTJ device 714 of FIG. 7, in addition to other circuits or information. To illustrate, the data file may include information corresponding to a system-on-chip (SOC) that includes the MTJ device 714 of FIG. 7 and that also includes additional electronic circuits and components within the SOC.

The GDSII file 1326 may be received at a fabrication process 1328 to manufacture the MTJ device 714 of FIG. 7, according to transformed information in the GDSII file 1326. For example, a device manufacture process may include providing the GDSII file 1326 to a mask manufacturer 1330 to create one or more masks, such as masks to be used for photolithography processing, illustrated as a representative mask 1332. The mask 1332 may be used during the fabrication process to generate one or more wafers 1334, which may be tested and separated into dies, such as a representative die 1336. The die 1336 includes a circuit including the MTJ device 714 of FIG. 7.

To illustrate, the fabrication process 1328 may include at least one computer that incorporates a processor executing instructions stored at a computer readable tangible storage medium, such as a memory device, to perform the method of FIG. 9 or the method of FIGS. 10-11. The computer may be coupled to one or more semiconductor fabrication devices and configured to execute instructions to initiate formation of a magnetic tunnel junction (MTJ) device on a structure that includes a bottom cap layer and a bottom metal-filled trench having a normal axis. The magnetic tunnel junction device includes a bottom electrode, magnetic tunnel junction layers, a magnetic tunnel junction seal layer, a top electrode, and a logic cap layer. The magnetic tunnel junction device has an MTJ axis that is offset from the normal axis. The computer may also be configured to execute instructions stored at the computer readable medium to initiate formation and planarization of an insulating layer above the logic cap layer. The computer may also be configured to execute instructions stored at the computer readable medium to initiate a copper damascene process to open a top trench in the insulating layer, to open a top via to the top electrode, to open a logic via to metal in the bottom metal-filled trench, or to open the top via and the logic via, to deposit copper in the top trench and in the top via, in the logic via, or in the top via and in the logic via, and to perform a copper chemical mechanical planarization of the deposited copper.

The die 1336 may be provided to a packaging process 1338 where the die 1336 is incorporated into a representative package 1340. For example, the package 1340 may include the single die 1336 or multiple dies, such as a system-in-package (SiP) arrangement. The package 1340 may be configured to conform to one or more standards or specifications, such as Joint Electron Device Engineering Council (JEDEC) standards.

Information regarding the package 1340 may be distributed to various product designers, such as via a component library stored at a computer 1346. The computer 1346 may include a processor 1348, such as one or more processing cores, coupled to a memory 1350. A printed circuit board (PCB) tool may be stored as processor executable instructions at the memory 1350 to process PCB design information 1342 received from a user of the computer 1346 via a user interface 1344. The PCB design information 1342 may include physical positioning information of a packaged semiconductor device on a circuit board, the packaged semiconductor device corresponding to the package 1340 including the MTJ device 714 of FIG. 7.

The computer 1346 may be configured to transform the PCB design information 1342 to generate a data file, such as a GERBER file 1352 with data that includes physical positioning information of a packaged semiconductor device on a circuit board, as well as layout of electrical connections such as traces and vias, where the packaged semiconductor device corresponds to the package 1340 including the MTJ device 714 of FIG. 7. In other embodiments, the data file generated by the transformed PCB design information may have a format other than a GERBER format.

The GERBER file 1352 may be received at a board assembly process 1354 and used to create PCBs, such as a representative PCB 1356, manufactured in accordance with the design information stored within the GERBER file 1352. For example, the GERBER file 1352 may be uploaded to one or more machines for performing various steps of a PCB production process. The PCB 1356 may be populated with electronic components including the package 1340 to form a representative printed circuit assembly (PCA) 1358.

The PCA 1358 may be received at a product manufacture process 1360 and integrated into one or more electronic devices, such as a first representative electronic device 1362 and a second representative electronic device 1364. As an illustrative, non-limiting example, the first representative electronic device 1362, the second representative electronic device 1364, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 1362 and 1364 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 13 illustrates remote units according to teachings of the disclosure, the disclosure is not limited to these exemplary illustrated units. Embodiments of the disclosure may be suitably employed in any device which includes active integrated circuitry including memory and on-chip circuitry.

Thus, the MTJ device 714 of FIG. 7, may be fabricated, processed, and incorporated into an electronic device, as described in the illustrative process 1300. One or more aspects of the embodiments disclosed with respect to FIGS. 1-11 may be included at various processing stages, such as within the library file 1312, the GDSII file 1326, and the GERBER file 1352, as well as stored at the memory 1310 of the research computer 1306, the memory 1318 of the design computer 1314, the memory 1350 of the computer 1346, the memory of one or more other computers or processors (not shown) used at the various stages, such as at the board assembly process 1354, and also incorporated into one or more other physical embodiments such as the mask 1332, the die 1336, the package 1340, the PCA 1358, other products such as prototype circuits or devices (not shown), or any combination thereof. For example, the GDSII file 1326 or the fabrication process 1328 can include a computer readable tangible medium storing instructions executable by a computer, the instructions including instructions that are executable by the computer to initiate formation of the MTJ device 714 of FIG. 7. Although various representative stages of production from a physical device design to a final product are depicted, in other embodiments fewer stages may be used or additional stages may be included. Similarly, the process 1300 may be performed by a single entity, or by one or more entities performing various stages of the process 1300.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), a spin-torque-transfer magnetoresistive random access memory (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
   forming a magnetic tunnel junction (MTJ) device on a structure that comprises a bottom cap layer and a bottom metal-filled trench having a normal axis, the magnetic tunnel junction device comprising a bottom electrode, magnetic tunnel junction layers, a magnetic tunnel junction seal layer, a top electrode, and a logic cap layer, the magnetic tunnel junction device having an MTJ axis that is offset from the normal axis;
   forming and planarizing an insulating layer above the logic cap layer; and
   performing a copper damascene process to open a top trench in the insulating layer, to open a top via to the top electrode, to open a logic via to metal in the bottom metal-filled trench, or to open the top via and the logic via, to deposit copper in the top trench and in the top via, in the logic via, or in the top via and in the logic via, and to perform a copper chemical mechanical planarization of the deposited copper.

2. The method of claim 1, wherein the offset of the MTJ axis from the normal axis is greater than a width of the magnetic tunnel junction layers.

3. The method of claim 1, wherein the bottom metal-filled trench is substantially filled with copper.

4. The method of claim 1, wherein the bottom metal-filled trench forms a copper pad, and wherein at least a portion of the bottom electrode is formed on the copper pad.

5. The method of claim 4, wherein the magnetic tunnel junction layers are not above the copper pad.

6. The method of claim 1, wherein the top via and the logic via are formed in a common process stage.

7. The method of claim 1, wherein an easy axis magnetic tunnel junction magnetic anneal of at least one of the magnetic tunnel junction layers aligns a magnetic field orientation of the magnetic tunnel junction device.

8. The method of claim 1, wherein the bottom cap layer comprises silicon carbide or silicon nitride.

9. The method of claim 1, wherein the bottom cap layer is formed before the bottom metal-filled trench is formed.

10. The method of claim 1, wherein the magnetic tunnel junction seal layer comprises silicon nitride or silicon carbide.

11. The method of claim 1, wherein the bottom electrode comprises tantalum or tantalum nitride and wherein the top electrode comprises tantalum or tantalum nitride.

12. The method of claim 1, wherein the logic cap layer comprises silicon carbide or silicon nitride.

13. The method of claim 1, wherein a height of the top via is adjustable.

14. An apparatus comprising:
   a semiconductor device formed by the method of claim 1.

15. The apparatus of claim 14, integrated in at least one semiconductor die.

16. The apparatus of claim 14, further comprising a device selected from a group consisting of a set top box, a music player, a video player, an entertainment unit, a navigation device, a communications device, a personal digital assistant (PDA), a fixed location data unit, and a computer, into which the semiconductor device is integrated.

17. A method comprising:
   forming a first insulating layer above a substrate;
   forming a bottom cap layer above the first insulating layer;
   performing a first copper damascene process to open bottom trenches and bottom vias in the first insulating layer, to plate copper in the bottom trenches and in the bottom vias, and to perform a copper chemical mechanical planarization, the copper-filled bottom trenches each having a normal axis;
   forming a bottom electrode above the bottom cap layer and above the copper-filled bottom trenches;
   forming magnetic tunnel junction layers above the bottom electrode;

forming a hardmask above the magnetic tunnel junction layers;
patterning magnetic tunnel junction (MTJ) structures each having an MTJ axis that is offset from the normal axis of an adjacent copper-filled bottom trench;
forming a magnetic tunnel junction seal layer above and adjacent to the magnetic tunnel junction structures and above the bottom electrode;
forming a second insulating layer above the magnetic tunnel junction seal layer;
planarizing the second insulating layer and opening tops of the magnetic tunnel junction structures;
forming a top electrode above the planarized second insulating layer and above the tops of the magnetic tunnel junction structures;
patterning the top electrode and the bottom electrode;
forming a logic cap layer above the bottom cap layer, the logic cap layer adjacent to the magnetic tunnel junction seal layer, adjacent to the second insulating layer, and above the patterned top electrode;
forming and planarizing a third insulating layer above the logic cap layer; and
performing a second copper damascene process to open at least one of a top via to the patterned top electrode and a logic via to one of the copper-filled bottom trenches and to open a top trench in the third insulating layer, to plate copper in the top trench and in the at least one of the top via and the logic via, and to perform a copper chemical mechanical planarization.

18. The method of claim 17, further comprising forming a final cap layer above the copper in the top trench and above the third insulating layer.

19. A method comprising:
a first step for forming a magnetic tunnel junction (MTJ) device on a structure that comprises a bottom cap layer and a bottom metal-filled trench having a normal axis, the magnetic tunnel junction device comprising a bottom electrode, magnetic tunnel junction layers, a magnetic tunnel junction seal layer, a top electrode, and a logic cap layer, the magnetic tunnel junction device having an MTJ axis that is offset from the normal axis;
a second step for forming and planarizing an insulating layer above the logic cap layer; and
a third step for performing a copper damascene process to open a top trench in the insulating layer, to open a top via to the top electrode, to open a logic via to metal in the bottom metal-filled trench, or to open the top via and the logic via, to deposit copper in the top trench and in the top via, in the logic via, or in the top via and in the logic via, and to perform a copper chemical mechanical planarization of the deposited copper.

20. A method comprising:
receiving design information representing at least one physical property of a semiconductor device, the semiconductor device comprising:
a structure that comprises a bottom cap layer surrounding a metal pad; and
a magnetic tunnel junction (MTJ) device comprising a bottom electrode coupled to the structure, the MTJ device comprising magnetic tunnel junction layers, a top electrode, and a logic cap layer, wherein the MTJ device is offset with respect to the metal pad;
wherein the semiconductor device is formed by a method comprising:
forming the magnetic tunnel junction (MTJ) device on the structure;
forming and planarizing an insulating layer above the logic cap layer; and
performing a copper damascene process to open a top trench in the insulating layer, to open a top via to the top electrode, to open a logic via to the metal pad, or to open the top via and the logic via, to deposit copper in the top trench and in the top via, in the logic via, or in the top via and in the logic via, and to perform a copper chemical mechanical planarization of the deposited copper;
transforming the design information to comply with a file format; and
generating a data file comprising the transformed design information.

21. The method of claim 20, wherein the data file comprises a GDSII format.

22. A method comprising:
receiving a data file comprising design information corresponding to a semiconductor device; and
fabricating the semiconductor device according to the design information, wherein the semiconductor device comprises:
a structure that comprises a bottom cap layer surrounding a metal pad; and
a magnetic tunnel junction (MTJ) device comprising a bottom electrode coupled to the structure, the MTJ device comprising magnetic tunnel junction layers, a top electrode, and a logic cap layer, wherein the MTJ device is offset with respect to the metal pad;
wherein the semiconductor device is formed by a method comprising:
forming the magnetic tunnel junction (MTJ) device on the structure;
forming and planarizing an insulating layer above the logic cap layer; and
performing a copper damascene process to open a top trench in the insulating layer, to open a top via to the top electrode, to open a logic via to the metal pad, or to open the top via and the logic via, to deposit copper in the top trench and in the top via, in the logic via, or in the top via and in the logic via, and to perform a copper chemical mechanical planarization of the deposited copper.

23. The method of claim 22, wherein the data file has a GDSII format.

24. A method comprising:
receiving design information comprising physical positioning information of a packaged semiconductor device on a circuit board, the packaged semiconductor device comprising a semiconductor structure comprising:
a structure that comprises a bottom cap layer surrounding a metal pad; and
a magnetic tunnel junction (MTJ) device comprising a bottom electrode coupled to the structure, the MTJ device comprising magnetic tunnel junction layers, a top electrode, and a logic cap layer, wherein the MTJ device is offset with respect to the metal pad;
wherein the semiconductor structure is formed by a method comprising:
forming the magnetic tunnel junction (MTJ) device on the structure;
forming and planarizing an insulating layer above the logic cap layer; and
performing a copper damascene process to open a top trench in the insulating layer, to open a top via to the top electrode, to open a logic via to the metal pad, or to open the top via and the logic via, to deposit copper in the top trench and in the top via, in the logic via, or in the top via and in the logic via, and to perform a copper chemical mechanical planarization of the deposited copper; and transforming the design information to generate a data file.

25. The method of claim 24, wherein the data file has a GERBER format.

26. A method comprising:
receiving a data file comprising design information comprising physical positioning information of a packaged semiconductor device on a circuit board; and
manufacturing the circuit board configured to receive the packaged semiconductor device according to the design information, wherein the packaged semiconductor device comprises a semiconductor structure comprising:
a structure that comprises a bottom cap layer surrounding a metal pad; and
a magnetic tunnel junction (MTJ) device comprising a bottom electrode coupled to the structure, the MTJ device comprising magnetic tunnel junction layers, a top electrode, and a logic cap layer, wherein the MTJ device is offset with respect to the metal pad;
wherein the semiconductor structure is formed by a method comprising:
forming the magnetic tunnel junction (MTJ) device on the structure;
forming and planarizing an insulating layer above the logic cap layer; and
performing a copper damascene process to open a top trench in the insulating layer, to open a top via to the top electrode, to open a logic via to the metal pad, or to open the top via and the logic via, to deposit copper in the top trench and in the top via, in the logic via, or in the top via and in the logic via, and to perform a copper chemical mechanical planarization of the deposited copper.

27. The method of claim 26, wherein the data file has a GERBER format.

28. The method of claim 26, further comprising integrating the circuit board into a device selected from a group consisting of a set top box, a music player, a video player, an entertainment unit, a navigation device, a communications device, a personal digital assistant (PDA), a fixed location data unit, and a computer.

29. An apparatus comprising:
means for forming a magnetic tunnel junction (MTJ) device on a structure that comprises a bottom cap layer and a bottom metal-filled trench having a normal axis, the magnetic tunnel junction device comprising a bottom electrode, magnetic tunnel junction layers, a magnetic tunnel junction seal layer, a top electrode, and a logic cap layer, the magnetic tunnel junction device having an MTJ axis that is offset from the normal axis;
means for forming and planarizing an insulating layer above the logic cap layer; and
means for performing a copper damascene process to open a top trench in the insulating layer, to open a top via to the top electrode, to open a logic via to metal in the bottom metal-filled trench, or to open the top via and the logic via, to deposit copper in the top trench and in the top via, in the logic via, or in the top via and in the logic via, and to perform a copper chemical mechanical planarization of the deposited copper.

30. The apparatus of claim 29, wherein the offset of the MTJ axis from the normal axis is greater than a width of the magnetic tunnel junction layers.

31. The apparatus of claim 29, wherein the top via and the logic via are formed in a common process stage.

32. The apparatus of claim 29, wherein the bottom metal-filled trench forms a copper pad and wherein at least a portion of the bottom electrode is formed on the copper pad.

33. The apparatus of claim 32, wherein the magnetic tunnel junction layers are not above the copper pad.

34. A non-transitory computer readable medium storing processor executable instructions that, when executed by a processor, cause the processor to initiate a method of forming a magnetic tunnel junction (MTJ) device, the method comprising:
forming a MTJ device on a structure that comprises a bottom cap layer and a bottom metal-filled trench having a normal axis, the magnetic tunnel junction device comprising a bottom electrode, magnetic tunnel junction layers, a magnetic tunnel junction seal layer, a top electrode, and a logic cap layer, the magnetic tunnel junction device having an MTJ axis that is offset from the normal axis;
forming and planarizing an insulating layer above the logic cap layer; and
performing a copper damascene process to open a top trench in the insulating layer, to open a top via to the top electrode, to open a logic via to metal in the bottom metal-filled trench, or to open the top via and the logic via, to deposit copper in the top trench and in the top via, in the logic via, or in the top via and in the logic via, and to perform a copper chemical mechanical planarization of the deposited copper.

35. The non-transitory computer readable medium of claim 34, wherein the offset of the MTJ axis from the normal axis is greater than a width of the magnetic tunnel junction layers.

36. The non-transitory computer readable medium of claim 34, wherein the top via and the logic via are formed in a common process stage.

37. The non-transitory computer readable medium of claim 34, wherein the bottom metal-filled trench forms a copper pad, and wherein at least a portion of the bottom electrode is formed on the copper pad.

38. The non-transitory computer readable medium of claim 37, wherein the bottom cap layer is formed before the bottom metal-filled trench is formed.

39. The non-transitory computer readable medium of claim 34, wherein an easy axis magnetic tunnel junction magnetic anneal of at least one of the magnetic tunnel junction layers aligns a magnetic field orientation of the magnetic tunnel junction device.

40. An apparatus comprising a semiconductor device formed by the method of claim 17.

41. The apparatus of claim 40, integrated in at least one semiconductor die.

42. The apparatus of claim 40, further comprising a device selected from a group comprising a set top box, a music player, a video player, an entertainment unit, a navigation device, a communications device, a personal digital assistant (PDA), a fixed location data unit, and a computer, into which the semiconductor device is integrated.

* * * * *